(12) United States Patent
Sivonen

(10) Patent No.: US 10,263,574 B2
(45) Date of Patent: Apr. 16, 2019

(54) RADIO FREQUENCY RECEIVER

(71) Applicant: Nordic Semiconductor ASA, Trondheim (NO)

(72) Inventor: Pete Sivonen, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 16/063,183

(22) PCT Filed: Oct. 31, 2016

(86) PCT No.: PCT/GB2016/053381
§ 371 (c)(1),
(2) Date: Jun. 15, 2018

(87) PCT Pub. No.: WO2017/103558
PCT Pub. Date: Jun. 22, 2017

(65) Prior Publication Data
US 2019/0007003 A1 Jan. 3, 2019

(30) Foreign Application Priority Data
Dec. 18, 2015 (GB) .................................. 1522373.8

(51) Int. Cl.
*H03F 3/45* (2006.01)
*H03F 1/56* (2006.01)
(Continued)

(52) U.S. Cl.
CPC ............ *H03F 1/56* (2013.01); *H03F 1/0205* (2013.01); *H03F 3/195* (2013.01);
(Continued)

(58) Field of Classification Search
None
See application file for complete search history.

(56) References Cited

U.S. PATENT DOCUMENTS 6,825,718 B2 * 11/2004 Kang .................... H03H 11/28
330/103
7,057,457 B2 * 6/2006 Irvine ................. H03F 3/45188
330/252
(Continued)

FOREIGN PATENT DOCUMENTS

GB 2481487 A 12/2011
GB 2490976 A 11/2012

OTHER PUBLICATIONS

International Search Report and Written Opinion for PCT/GB2016/053381, dated Jan. 18, 2017, 12 pages.
(Continued)

*Primary Examiner* — Tuan A Tran
(74) *Attorney, Agent, or Firm* — Klarquist Sparkman, LLP

(57) ABSTRACT

A radio frequency receiver device comprises: a receiver input arranged to receive signals having one or more frequency components within a frequency spectrum; a filter having a filter output impedance; and an amplifier comprising: an amplifier input (134a, 134b) connected to the filter output; an amplifier output 72a, 72b); at least one radio frequency input transistor (144a, 144b); and a feedback circuit including at least one feedback resistor (146a, 146b). The device is arranged to be selectably operable in: a first mode wherein the amplifier has first feedback resistance and transconductance values respectively such that the amplifier input impedance and the filter output impedance are substantially the same; and a second mode having second feedback resistance and transconductance values such that upon connection of a predetermined external impedance matching circuit (160) between the filter and the amplifier, the amplifier input impedance and the filter output impedance are substantially the same.

22 Claims, 12 Drawing Sheets

(51) Int. Cl.
  *H03F 3/195* (2006.01)
  *H03F 3/72* (2006.01)
  *H03F 1/02* (2006.01)
  *H04B 1/16* (2006.01)

(52) U.S. Cl.
  CPC ..... *H03F 3/45475* (2013.01); *H03F 3/45941* (2013.01); *H03F 3/72* (2013.01); *H04B 1/16* (2013.01); *H03F 2200/144* (2013.01); *H03F 2200/165* (2013.01); *H03F 2200/222* (2013.01); *H03F 2200/294* (2013.01); *H03F 2200/372* (2013.01); *H03F 2200/451* (2013.01); *H03F 2203/45231* (2013.01); *H03F 2203/45576* (2013.01)

(56) References Cited

U.S. PATENT DOCUMENTS

| | | | | |
|---|---|---|---|---|
| 7,446,604 B2* | 11/2008 | Yeh | ............ | H03F 3/72 |
| | | | | 330/126 |
| 7,843,272 B2* | 11/2010 | Yamaguchi | ............... | H03F 1/22 |
| | | | | 330/292 |
| 7,956,682 B2* | 6/2011 | Hasegawa | ............... | H03F 1/223 |
| | | | | 330/311 |
| 7,991,370 B2* | 8/2011 | Kabashima | ............... | H03F 1/34 |
| | | | | 455/188.1 |
| 8,264,282 B1* | 9/2012 | Riekki | .................... | H03F 1/301 |
| | | | | 330/260 |
| 8,319,555 B1* | 11/2012 | Heikkinen | ............... | H03F 1/565 |
| | | | | 330/283 |
| 8,378,748 B2* | 2/2013 | Heikkinen | ............ | H03F 1/0277 |
| | | | | 330/260 |
| 8,427,239 B2* | 4/2013 | Riekki | .................... | H03F 1/56 |
| | | | | 330/302 |
| 8,436,684 B2* | 5/2013 | Riekki | ................. | H03F 1/0277 |
| | | | | 330/302 |
| 8,503,967 B2* | 8/2013 | Liao | ......................... | H03F 1/56 |
| | | | | 330/124 R |
| 8,514,021 B2* | 8/2013 | Heikkinen | ............. | H03F 1/565 |
| | | | | 330/260 |
| 9,071,201 B2* | 6/2015 | Jones | ................... | H03F 1/0205 |
| 9,673,765 B2* | 6/2017 | Seong | .................... | H03F 3/193 |
| 2007/0024377 A1 | 2/2007 | Wang et al. | | |
| 2008/0211582 A1 | 9/2008 | Lin | | |
| 2010/0259319 A1 | 10/2010 | Chan et al. | | |
| 2013/0029627 A1 | 1/2013 | Song et al. | | |

OTHER PUBLICATIONS

Search Report under Section 17(5) for GB1522373.8, dated Jun. 3, 2016, 3 pages.

* cited by examiner

RADIO FREQUENCY RECEIVER

CROSS REFERENCE TO RELATED APPLICATIONS

This is the U.S. National Stage of International Application No. PCT/GB2016/053381, filed Oct. 31, 2016, which was published in English under PCT Article 21(2), which in turn claims the benefit of Great Britain Application No. 1522373.8, filed Dec. 18, 2015.

The present invention relates to radio frequency receiver devices, particularly radio frequency receiver integrated circuit (RFIC) devices.

Radio frequency receiver devices are commonly used in order to receive signals transmitted by a radio frequency transmitter, which may be located some distance from the receiver and thus the transmitted signals travel wirelessly over the air. The radio frequency receiver then utilises an antenna in order to receive the signals.

Given the number of signals that are transmitted wirelessly in the radio frequency range of the electromagnetic spectrum (which ranges from approximately 3 kHz to approximately 300 GHz) as well as sources of noise, the antenna will typically "pick up" signals across a broad range of frequencies. In order to isolate the desired signals from the rest of the received signals, the antenna is usually connected to a bandpass filter that allows only the desired frequencies to pass through, while removing everything else. The filtered signal is then passed through an amplifier—typically a low-noise amplifier (LNA)—implemented within the RFIC in order to amplify the signal prior to any further signal processing e.g. demodulation.

It is well documented in the art that in order to ensure optimal passband characteristics, such as maximum power transfer from the filter to the amplifier and minimal signal reflections at the amplifier, the output impedance of the filter should be "matched" to the input impedance of the amplifier i.e. the impedances should be equal or as close to equal as possible. Some RFIC devices, such as the LTC6410-6 produced by Linear Technology® Inc., have configurable input impedances that provide the ability to match their input impedance to the output of a given component such as a filter.

In general amplifiers and filters will have different impedances. The filters used to select the desired frequency bands are typically impedance matched to the antenna, and thus have a characteristic impedance of e.g. approximately 50 ohms if the filter is designed to produce a single-ended (or "zero-referenced") output for unbalanced signals, or e.g. 100 ohms if the filter is designed to produce a differential output for balanced signals. Amplifiers will have an impedance dictated by their design requirements.

So as to match the input impedance of the amplifier to the output impedance of the filter, an impedance matching network can be applied to the amplifier. This impedance matching network may be implemented on-chip i.e. it may be integrated into the RFIC such that the filter can be directly connected to the RFIC seamlessly; or it may be implemented off-chip i.e. a separate, external circuit such as a passive inductor-capacitor (LC) circuit is connected between the filter and the RFIC.

Using an on-chip implementation for impedance matching typically requires fewer components than an off-chip implementation. In general, receivers to which the invention is applied may be designed for use with multiple frequency bands and thus have multiple LNAs within the RFIC, each of which will require impedance matching to a bandpass filter. An off-chip implementation in this scenario would thus require a large number of components in order to match each filter to each LNA. However the Applicant has appreciated that there is a trade-off since such off-chip implementations, can be designed to have a lower power consumption requirement than an equivalent on-chip implementation. This presents system designers wishing to implement such a radio frequency receiver with a choice between using more components (thus increasing the cost of the resulting receiver) or having a lower power consumption, which is often very important for battery powered portable devices such as smartphones, tablets, wearables etc.

When viewed from a first aspect, the present invention provides a radio frequency receiver device comprising:
- a receiver input arranged to receive signals having one or more frequency components within a frequency spectrum;
- a filter having a filter output impedance; and
- an amplifier comprising: an amplifier input connected to the filter output; an amplifier output; at least one radio frequency input transistor; and a feedback circuit including at least one feedback resistor, said feedback circuit being connected between the amplifier input and the amplifier output;
- wherein the device is arranged to be selectably operable in:
  - a first mode wherein the amplifier has first feedback resistance and transconductance values respectively such that the amplifier input impedance and the filter output impedance are substantially the same; and
  - a second mode wherein the amplifier has second feedback resistance and transconductance values respectively such that upon connection of a predetermined external impedance matching circuit between the filter and the amplifier, the amplifier input impedance and the filter output impedance are substantially the same.

Thus it will be appreciated by those skilled in the art that in accordance with the present invention there is provided a radio frequency receiver device wherein the resistance and transconductance of an amplifier thereof can be switched between different values corresponding to on- or off-chip impedance matching implementations. This allows a common chip to be used by customers who wish to minimise the cost (with a smaller bill of materials) associated with their end product by implementing the integrated impedance matching capability, or reduce power consumption by implementing an external impedance matching circuit.

The Applicant has appreciated that it is particularly advantageous to ensure that there is no penalty associated with either mode of the device regarding noise and linearity of the amplifier and, by extension, the radio receiver as a whole. Accordingly, in some embodiments a noise figure associated with the device when it is operated in the first mode is substantially equal to the noise figure when it is operated in the second mode with the predetermined external impedance matching circuit connected. Similarly in some potentially overlapping embodiments, a gain associated with the device when it is operated in the first mode is substantially equal to the gain when it is operated in the second mode with the predetermined external impedance matching circuit connected. In such embodiments, a customer can decide between reducing either the cost or the power consumption of the device without concern as to the resulting performance of the device, since it has nearidentical performance in both modes. This allows a manufacturer to offer a genuine choice in implementation without compromising performance.

The Applicant has appreciated that there are a number of possible arrangements suitable for configuring or switching the transconductance value associated with the amplifier, which is normally dependent upon the aspect ratio of the transistor(s) (i.e. the ratio between the width and the length of the transistor) and the current flowing therethrough. In a particular set of embodiments, the amplifier further comprises a mirror transistor arranged to form a current mirror arrangement with the at least one radio frequency input transistor; and a variable current source operable to set the current flowing through the current mirror arrangement to either a first current in the first mode or a second current in the second mode. By varying the current flowing through the mirror transistor, the amount of current that can flow through the at least one radio frequency input transistor is also varied, effectively altering the transconductance of a radio frequency input transistor that has a fixed aspect ratio.

However, the Applicant has appreciated that it is also possible to vary the aspect ratio of the transistor in addition to or instead of varying the current. Accordingly, in a potentially overlapping set of embodiments, the amplifier comprises first and second radio frequency input transistors in parallel, wherein the first radio frequency input transistor has a first aspect ratio and is in series with a first selection transistor, and the second radio frequency input transistor has a second aspect ratio and is in series with a second selection transistor, wherein the first and second aspect ratios are different. In such embodiments, it is possible to switch between using the first and second radio frequency input transistors by enabling the first or second selection transistor respectively while disabling the other. Since the two are in parallel, the circuits for both the on-chip and off-chip matching that can be selected with relative ease.

There are numerous ways of altering the resistance value of the feedback resistor e.g. using a variable resistor. However, the Applicant has appreciated that it is advantageous, at least in some embodiments, that the feedback circuit comprises first and second feedback resistors in parallel, wherein the first feedback resistor is in series with a first switch and wherein the second feedback resistor is in series with a second switch and the first and second switches are arranged such that while one switch is closed, the other is open.

As it is usually desirable to match the impedance of a filter to the following amplifier stage regardless of what the amplifier stage actually comprises the invention may be used in a number of contexts. However, in some embodiments, the amplifier is a low noise amplifier. Low noise amplifiers are used in radio frequency applications to amplify relatively weak signals while adding as little noise as possible.

The radio frequency receiver device of the present invention could be implemented using any transistor technology known in the art per se such as bipolar junction transistors (BJTs), junction field-effect transistors (JFETs), or preferably metal-oxide-semiconductor field-effect transistors (MOSFETs).

In some embodiments, the feedback circuit further includes at least one feedback capacitor. Adding capacitance to the feedback path acts as an additional, high-pass filtering stage that blocks direct current (DC) signals. The capacitance of the feedback capacitor can then be chosen to minimise the impedance thereof (i.e. act as a short circuit) for radio frequency signals.

In some embodiments, the radio frequency receiver device further comprises a downconversion mixer connected to the output of the amplifier. An analogue baseband filter may be connected to an output of the downconversion mixer. The analogue baseband filter may be implemented using a low pass filter. An analogue-to-digital converter may be connected to an output of the analogue baseband filter. The analogue-to-digital converter (ADC) then produces a digital signal output suitable for use by other circuit components or with further signal processing.

The principles of the present invention may be readily applicable to amplifiers that have single-side or differential inputs and/or outputs. Accordingly, in a set of embodiments the amplifier input is single-ended. In an alternative set of embodiments, the amplifier input is differential. In an overlapping set of embodiments, the amplifier output is single-ended. In an alternative, overlapping set of embodiments, the amplifier output is differential.

While a single filter and amplifier might be useful for receiving radio frequency transmissions within a single band of frequencies, it is common for multi-band receivers to be designed such that they can receive transmission across a number of different frequency bands. Accordingly, in some embodiments the radio frequency receiver device comprises a plurality of amplifiers and a plurality of filters, wherein the input of each amplifier is connected to the output of a corresponding filter such that in the first mode each amplifier has first feedback resistance and transconductance values respectively such that the input impedance of each amplifier and the output impedance of the filter to which said amplifier is connected are substantially the same; and in the second mode each amplifier has second feedback resistance and transconductance values respectively such that upon connection of predetermined external impedance matching circuits between each amplifier and its corresponding filter, the input impedance of each amplifier and the output impedance of the filter to which said amplifier is connected are substantially the same.

The present invention extends to a radio frequency receiver device comprising:
  a receiver input arranged to receive signals having one or more frequency components within a frequency spectrum;
  a plurality of filters each having a filter output impedance; and
  a plurality of amplifiers each comprising: an amplifier input connected to the output of a corresponding one of the plurality of filters; an amplifier output; at least one radio frequency input transistor; and a feedback circuit including at least one feedback resistor, said feedback circuit being connected between the amplifier input and the amplifier output;
  wherein the device is arranged to be selectably operable in:
    a first mode wherein each amplifier has first feedback resistance and transconductance values respectively such that each amplifier input impedance is substantially the same as the output impedance of the corresponding filter; and
    a second mode wherein each amplifier has second feedback resistance and transconductance values respectively such that upon connection of a predetermined external impedance matching circuit between each amplifier and the corresponding filter, each amplifier input impedance is substantially the same as the output impedance of the corresponding filter.

While the filter may, for example, comprise a low-pass filter or a high-pass filter, in some embodiments the filter is a bandpass filter. Bandpass filters are useful in radio frequency applications for selecting a specific, desired range of frequencies with an upper and lower bound.

In some embodiments, the radio frequency receiver device is implemented within a radio frequency integrated circuit (RFIC).

Certain embodiments of the invention will now be described, by way of example only, with reference to the accompanying drawings in which.

Figure 1:
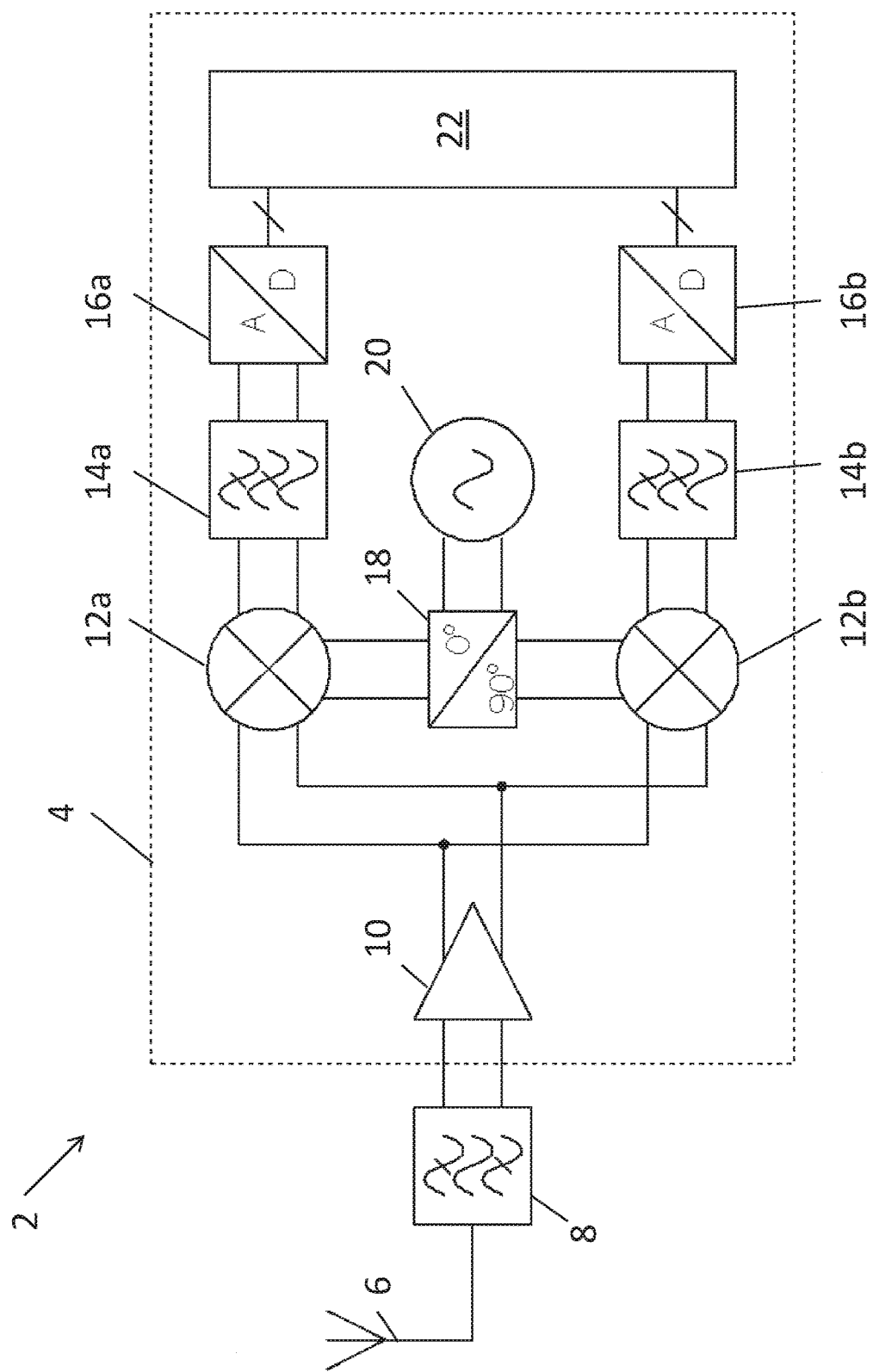
FIG. 1 shows a schematic diagram of radio frequency receiver device.

FIG. 1 shows a radio frequency receiver 2 that includes a radio frequency integrated circuit (RFIC) 4. The receiver 2 is arranged such that radio frequency signals can be received by an antenna 6. The received signals are filtered using a bandpass filter 8, external to the RFIC 4, before being input to the RFIC 4.

The RFIC 4 comprises a fully differential low-noise amplifier (LNA) 10 which takes a differential input from the filter 8 (the filter 8 comprising a balun that converts the unbalanced signal from the antenna 6 to a balanced signal) and produces a differential output which is input to a pair of quadrature mixers 12a, 12b. Each of these mixers 12a, 12b is provided with either an in-phase or quadrature version of a local oscillator signal produced by a local oscillator 20 and shifted either 0° or 90° by phase shifter 18.

These mixers produce fully differential in-phase (or "I") and quadrature (or "Q") signals that are filtered by low-pass filters 14a, 14b before being converted to digital signals by analogue-to-digital convertors 16a, 16b respectively. The resulting digital I and Q signals are then further processed using a digital demodulator 22.

Figure 2:
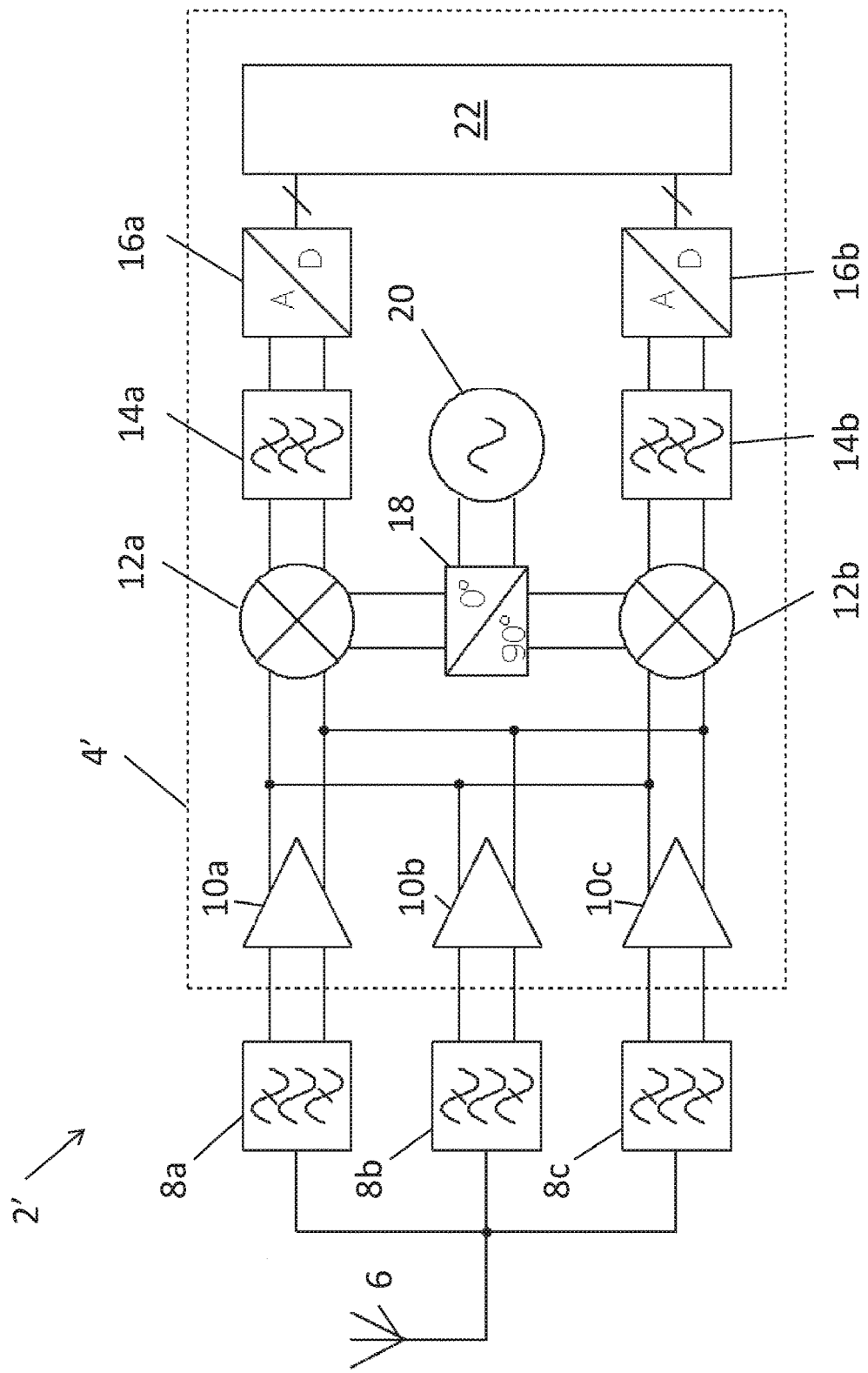
FIG. 2 shows a multi-band radio frequency receiver device.

FIG. 2 shows a multi-band version of the radio frequency receiver device 2' that is arranged to receive signals across a number of frequency ranges within the radio frequency spectrum. As with the receiver of FIG. 1, the antenna 6 receives the radio frequency signals, which are then input to three different bandpass filters 8a, 8b, 8c that are each arranged with a different passband so as to select the desired frequency ranges while rejecting signals outside these ranges. Each filter 8a, 8b, 8c is connected to a respective fully differential LNA 10a, 10b, 10c which amplify the respective filtered signals prior to processing by the demodulation circuit as discussed previously with reference to FIG. 1.

Each of the filters 8, 8a, 8b, 8c must be impedance matched with their respective low-noise amplifiers 10, 10a, 10b, 10c in order to prevent the generation of undesirable ripples in the passbands of the filters and to maximise power transfer (i.e. reducing the amount of signal reflection that occurs at the interface between the filters 8, 8a, 8b, 8c and the LNAs 10, 10a, 10b, 10c). Two methods of achieving the matched impedance will be described with reference to FIGS. 3 and 4 below.

Aside from matching the LNA input impedance to the filter impedance, a desirable LNA 10, 10a, 10b, 10c should have a low noise figure (NF) and be sufficiently linear across its operating range of frequencies. In addition, the LNAs 10, 10a, 10b, 10c desirably have sufficiently high gain ($A_v$) in order to maintain a high signal-to-noise ratio (SNR). The noise figure (NF) and third-order input-referred intercept point (IIP3)—a good measure of circuit linearity—of a typical radio receiver 4 are given below with reference to Equations 1 and 2 respectively:

$$NF = NF_{LNA} + \frac{NF_2 - 1}{\left(\frac{A_{v,LNA}}{2}\right)^2} \quad \text{Equation 1}$$

Noise figure $NF$ of an integrated radio frequency receiver device including an $LNA$ $$\frac{1}{IIP3} = \frac{1}{IIP3_{LNA}} + \frac{A_{v,LNA}^2}{IIP3_2} \quad \text{Equation 2}$$

Third-order input-referred intercept point $IIP3$ of an integrated radio frequency receiver device including an $LNA$ wherein: $NF_{LNA}$ is the LNA NF, $A_{v,LNA}$ is the LNA voltage gain, $IIP3_{LNA}$ is the LNA IIP3, $NF_2$ is the combined NF of the circuits following the LNA (mixers 12a, 12b; low-pass filters 14a, 14b; and ADCs 16a, 16b), and $IIP3_2$ is the combined IIP3 of the circuits following the LNA.

Figure 3:
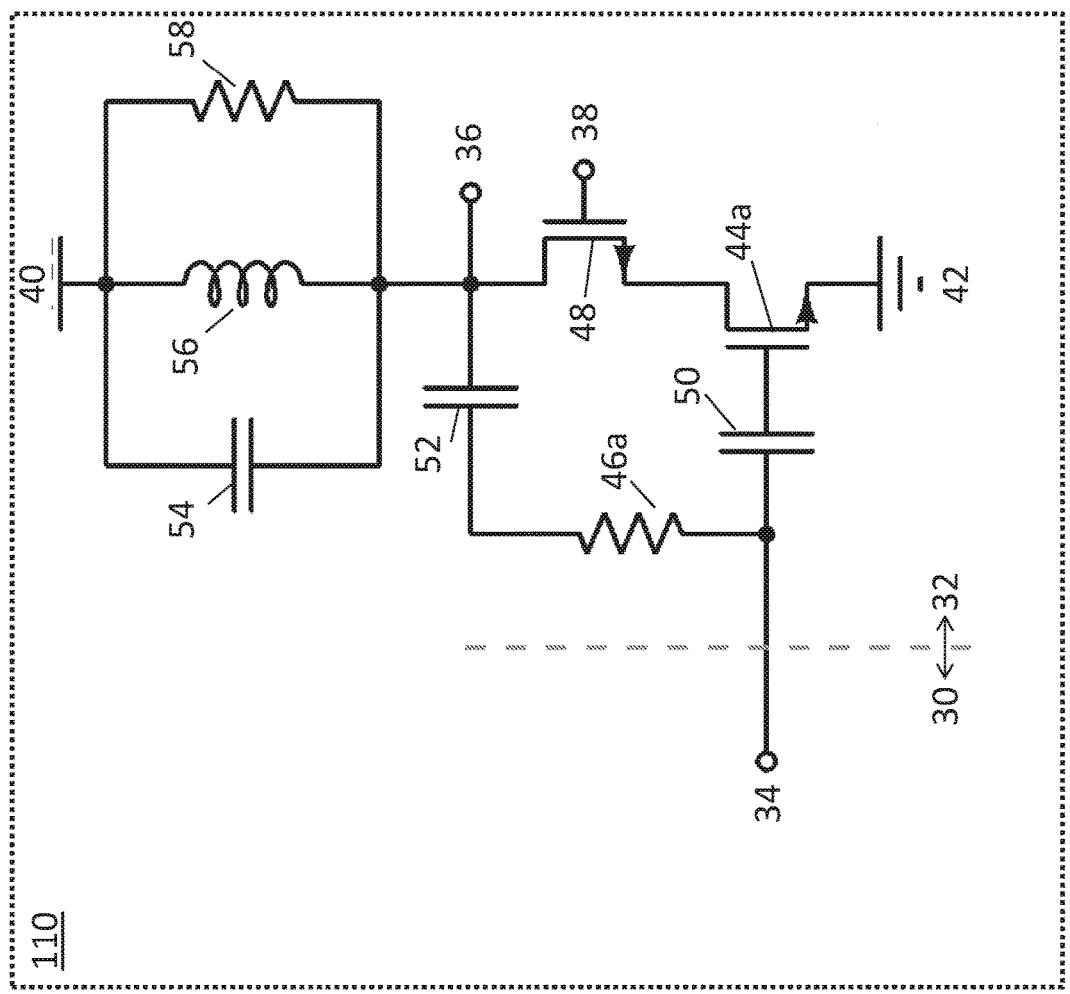
FIG. 3 shows a prior art amplifier arrangement with on-chip impedance matching.

FIG. 3 shows an amplifier arrangement with on-chip impedance matching (biasing details are omitted for clarity), known in the art per se. In this arrangement, the LNA 110 comprises: an input terminal 34; an output terminal 36; an n-channel metal-oxide-semiconductor field-effect transistor (nMOSFET) radio frequency (RF) input transistor 44a; an nMOSFET cascode transistor 48 with a gate terminal 38; a feedback resistor 46a; a feedback capacitor 52; a DC block capacitor 50; and a resistor-inductor-capacitor (RLC) resonance arrangement including a resistor 58, an inductor 56 and a capacitor 54. As can be seen from FIG. 3, all of the components within the amplifier 110 are on the "on-chip" side 32 of the LNA 110 and no components are present on the "off-chip" side 30. The amplifier 10 is connected between a power supply rail 40 and ground 42.

At radio frequencies, it is assumed that the feedback capacitor 52 and the DC block capacitor 50 act as short circuits. It is also assumed that the inductor 56 and capacitor 54 are chosen so as to resonate at the principal frequency of interest $f_0$ for which the LNA 110 is designed e.g. the central frequency of the frequency range to be received, as per Equation 3 below:

$$f_0 = \frac{1}{2\pi\sqrt{L_L C_L}} \qquad \text{Equation 3}$$

Resonant frequency $f_0$ of LC resonator wherein $L_L$ is the inductance of the inductor 56 and $C_L$ is the capacitance of the capacitor 54.

Due to the negative feedback arrangement, the LNA input resistance $R_{in}$ at $f_0$ is given by Equation 4 below:

$$R_{in} = \frac{R_{F1} + R_L}{g_{m1} R_L} \qquad \text{Equation 4}$$

LNA input resistance at $f_0$ wherein: $R_{F1}$ is the resistance of the feedback resistor 46a; $g_{m1}$ is the transconductance of the RF input transistor 44a; and $R_L$ is the resistance of the resonance resistor 58.

In order to match impedances, the LNA input resistance $R_{in}$ must be equal to the source resistance ($R_s$, i.e. usually 50Ω) or the resistance at which the filter 8 is designed to be terminated.

With matched impedances ($R_{in}=R_s$), the voltage gain ($A_v$) and noise figure (NF) of the LNA 110 shown in FIG. 3 can be approximated as per Equations 5 and 6 below (wherein γ is a noise constant, typically taken to be ⅔ for long-channel MOSFETs):

$$A_v = \frac{R_{F1}}{R_s} \qquad \text{Equation 5}$$

Voltage gain $A_v$ with matched impedance $$NF = 1 + \frac{\gamma}{g_{m1} R_s} + \frac{(1 + g_{m1} R_s)^2}{g_{m1}^2 R_{F1} R_s} \qquad \text{Equation 6}$$

Noise figure NF with matched impedance

Assuming $g_{m1} R_s \gg 1$, NF can be written as per Equation 7:

$$NF = 1 + \frac{\gamma}{g_{m1} R_s} + \frac{R_s}{R_{F1}} \qquad \text{Equation 7}$$

Approximation of noise figure NF with matched impedance

Figure 4:
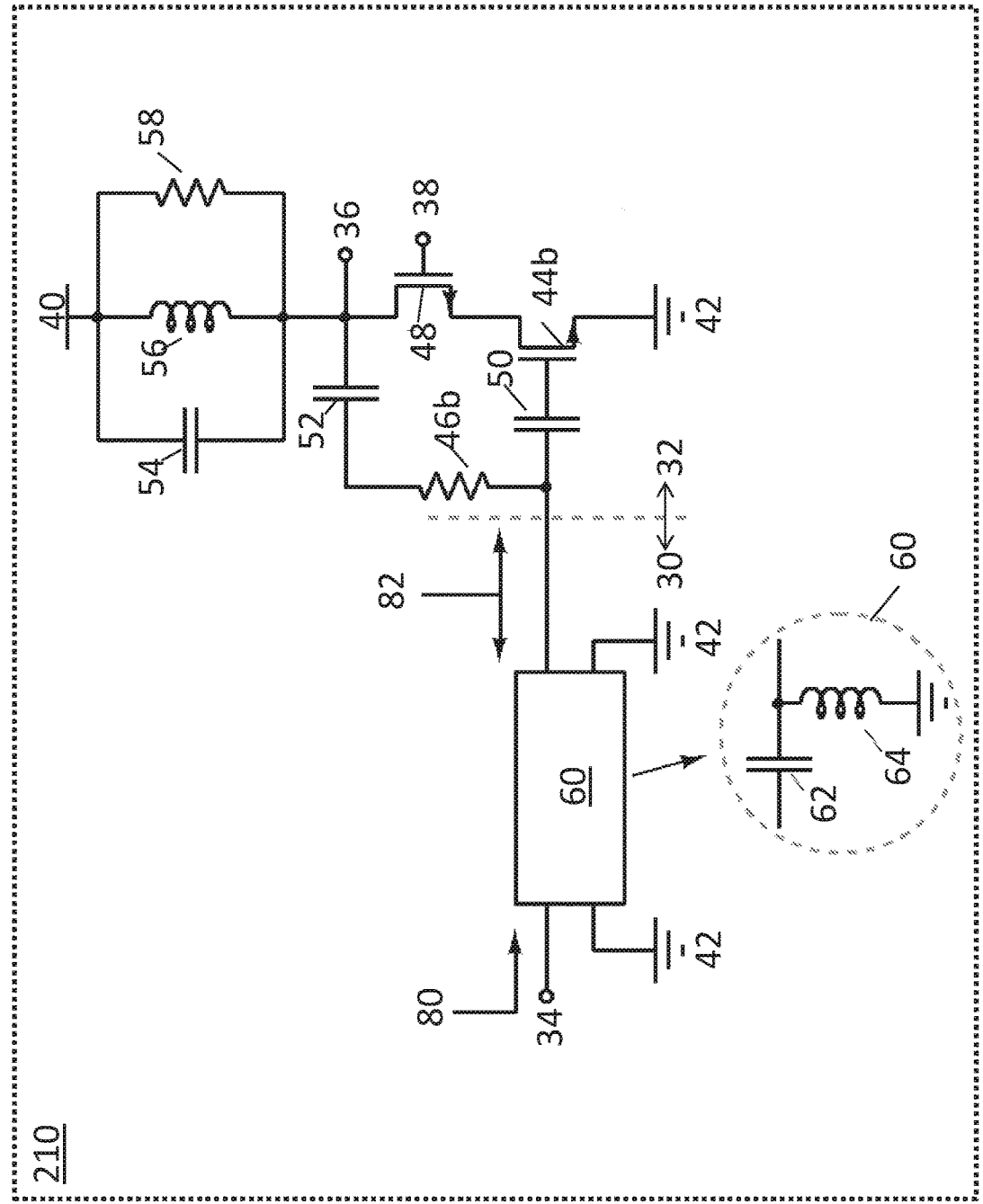
FIG. 4 shows a prior art amplifier arrangement with off-chip impedance matching.

By way of contrast, FIG. 4 shows an amplifier arrangement with off-chip impedance matching, known in the art per se. In this case, the components on the on-chip side 32 of the LNA 210 are largely the same as the on-chip side 32 of the LNA 110 in FIG. 3; however the feedback resistor 46b and the RF input transistor 44b have resistance value $R_{F2}$ and transconductance value $g_{m2}$ respectively.

In contrast to FIG. 3, the LNA 210 shown in FIG. 4 has an external impedance matching circuit 60 connected between the on-chip side of the LNA 210 and the filter (not shown) i.e. the filtered signals from the filter pass from the input terminal 34 through the external impedance matching circuit 60 prior to input into the on-chip input of the amplifier 210. The external impedance matching circuit 60 itself comprises a ladder network of an impedance matching capacitor 62 and a impedance matching inductor 64. It will however be appreciated that this is simply one example of an impedance matching circuit and any such impedance matching circuit falls within the scope of the present invention.

In this case, the impedance 82 "looking into" the on-chip components of the LNA 210 is designed to be larger than the input impedance 80 looking into the external impedance matching circuit 60. The ratio of these impedances is denoted as $N^2$ in Equation 8 below:

$$N^2 = \frac{R_{EQ}}{R_{in}} = \frac{R_{EQ}}{R_s} \qquad \text{Equation 8}$$

Ratio of impedances for off-chip impedance matching wherein: $R_{EQ}$ is the impedance 82 looking into the on-chip part of the LNA 210, $R_{in}$ is the input impedance 80 of the entire LNA 210 including the external impedance matching circuit 60, and N>1. It is assumed that the external impedance matching circuit 60 is designed such that its input impedance $R_{in}$ is equal to the source impedance $R_s$ (i.e. the impedance of the filter 8).

In addition, at the frequency of interest $f_0$, the LNA 210 load impedance forms a parallel resonance circuit and the impedance 82 looking into the on-chip part of the LNA 210 at $f_0$ is given as per Equation 9:

$$R_{EQ} = \frac{R_{F2} + R_L}{g_{m2} R_L} \qquad \text{Equation 9}$$

Input resistance looking into the on-chip part of the LNA at $f_0$

With the impedance of the filter 8 matched to the LNA input resistance 80 (i.e. $R_{in}=R_s$), the voltage gain ($A_v$) and noise figure (NF) of the LNA 210 shown in FIG. 4 can be approximated as per Equations 10 and 11 below:

$$A_v = N \times \frac{R_{F2}}{R_{EQ}} = \sqrt{\frac{R_{EQ}}{R_s}} \frac{R_{F2}}{R_{EQ}} \qquad \text{Equation 10}$$

Voltage gain of LNA 210 with off-chip impedance matching shown in FIG. 4

$$NF = 1 + \frac{R_{LOSS}}{R_s} + \frac{\gamma}{g_{m2} R_{EQ}} + \frac{(1 + g_{m2} R_{EQ})^2}{g_{m2}^2 R_{F2} R_{EQ}} \qquad \text{Equation 11}$$

Noise figure of LNA 210 with off-chip impedance matching shown in FIG. 4 wherein: N is the voltage gain in the matching circuit;

$$\frac{R_{F2}}{R_{EQ}}$$

is the gain from the LNA on-chip input to the LNA output; and $R_{LOSS}$ represents resistive losses in the external impedance matching circuit 60.

A comparison of the performance of conventional on-chip and off-chip impedance matching solutions as described with reference to FIGS. 3 and 4 above is discussed below. It is assumed that the LNA resonant load component values ($R_L$, $L_L$, and $C_L$) are equal in both arrangements. It is also assumed that in both arrangements, the LNA input resistance ($R_{in}$) is matched to the source resistance ($R_s$=50Ω). Furthermore, it is assumed that both LNAs are designed for equal voltage gain $$A_v = \frac{v_{out}}{v_{in}}.$$

By equating the voltage gains of the LNAs 110, 210 with on- and off-chip impedance matching (see Equations 5 and 10 respectively) in accordance with the principle behind the present invention, Equations 12 and 13 may be derived as shown below:

Equating the voltage gains of LNAs
with on- and off-chip impedance matching $$\frac{R_{F1}}{R_s} = \sqrt{\frac{R_{EQ}}{R_s}} \frac{R_{F2}}{R_{EQ}} \qquad \text{Equation 12}$$

from which:

$$R_{F2} = N R_{F1}$$

Equation 13: Relationship Between Feedback Resistance Values Needed for On- and Off-chip Impedance Matching Similarly, the relation between the transconductances of the RF input transistors 44a, 44b needed for on- and off-chip impedance matching respectively are given as per Equations 14 and 15 below:

Equating the voltage gains of LNAs
with on- and off-chip impedance matching $$g_{m2} = \left(R_{F1} + \frac{R_L}{N}\right)\frac{g_{m1}}{N(R_{F1} + R_L)} \qquad \text{Equation 14}$$

from which if $R_{F1} \gg R_L$:

Relationship between transconductance values
needed for on- and off-chip impedance matching $$g_{m2} \approx \frac{g_{m1}}{N} \qquad \text{Equation 15}$$

It may be seen that when designed for equal voltage gain, the resistive feedback (RFB) LNA 210 with off-chip impedance matching (wherein the impedance matching circuit 60 has impedance scaling factor of $N^2$) allows scaling up of the resistance of the feedback resistor 46b by N compared to the feedback resistor 46a in the LNA 110 with on-chip matching. Likewise, the transconductance of the RF input transistor 44b in the LNA 210 with off-chip impedance matching can be scaled down approximately by a factor of N compared to the RF input transistor 44a in the LNA 110 with on-chip matching.

In saturation mode, the transconductance of an RF input transistors 44a, 44b can be written as per Equation 16:

Transconductance of RF input transistor in saturation mode $$g_{m2} = \frac{2I_{DS}}{V_{GS} - V_t} = \sqrt{2\mu C_{ox} \frac{W}{L} I_{DS}} \qquad \text{Equation 16}$$

wherein, with reference to the RF input transistors 44a, 44b: $I_{DS}$ is the drain-source current; $V_{GS}$ is the gate-source voltage; $V_t$ is the threshold voltage; $C_{ox}$ is the oxide capacitance;

$$\frac{W}{L}$$

is the aspect ratio; and μ is the charge carrier mobility.

Thus, for example, when designed for equal effective gate-source voltage ($V_{GS}-V_t$) so as to guarantee the same IIP3 and voltage gain $A_v$ in both configurations, the drain-source current in the LNA 210 with off-chip impedance matching can be scaled down about by a factor of N compared to the LNA 110 with on-chip matching. Alternatively, when designed for equal aspect ratio $$\left(\frac{W}{L}\right),$$

the drain-source current in the LNA 210 with off-chip impedance matching can be scaled down about by a factor of $N^2$ compared to the LNA 110 with on-chip matching.

However, typically the voltage-to-current conversion at the RF input transistor 44a, 44b limits the IIP3 of the LNA 110, 210. This results in lower IIP3 in the LNA 210 with off-chip matching compared to the LNA 110 with on-chip matching. Nevertheless, in practice, employing an LNA 210 with off-chip input impedance matching can result in tens of percentage savings (typically around 40%) in power consumption compared to the LNA 110 with complete on-chip input impedance matching. Of course, this advantage comes with the cost of external matching components as discussed previously. However it will be appreciated that, at least with some portable devices, low power consumption may be more important than the bill of materials, and thus utilising off-chip, external impedance matching circuits may be a preferred option.

By using Equations 13 and 14 and assuming that $gm_1 R_s \gg 1$, the NF of the LNA 210 with off-chip impedance matching can be written in terms of the transconductance $gm_1$ of the RF input transistor 44a and the resistance $R_{F1}$ of the feedback resistor 46a of the LNA 110 with on-chip matching as per Equation 17:

Noise figure of LNA 210 with off-chip matching
in terms of the transconductance and feedback
resistance associated with on-chip matching $$NF = 1 + \frac{R_{LOSS}}{R_s} + \frac{\gamma}{N g_{m1} R_s} + \frac{(N g_{m1} R_s + 2)^2}{N g_{m1}^2 R_s R_{F1}} \qquad \text{Equation 17}$$

By using Equation 17, the NF of the LNA 210 using off-chip matching network can be now easily compared to the NF of the LNA 110 with on-chip matching (see Equation 5). It can be seen that the NF of the LNA 210 with off-chip matching includes a term $R_{LOSS}$ due to resistive losses in the external impedance matching circuit 60, which is not present in the LNA 110 with on-chip matching. This term is usually relatively small, since the matching network can be implemented using high quality factor (or "Q-factor") components (i.e. the inductors 64 and capacitors 62) which have relatively low losses associated therewith. It can also be seen that that the second term representing the noise contribution due to the RF input transistor 44b is lower by a factor of N than in the LNA 110 with on-chip matching. However, it can be seen that the last term relating to the noise in feedback resistor 46b is larger compared to the LNA 110 using on-chip matching.

Figure 5:
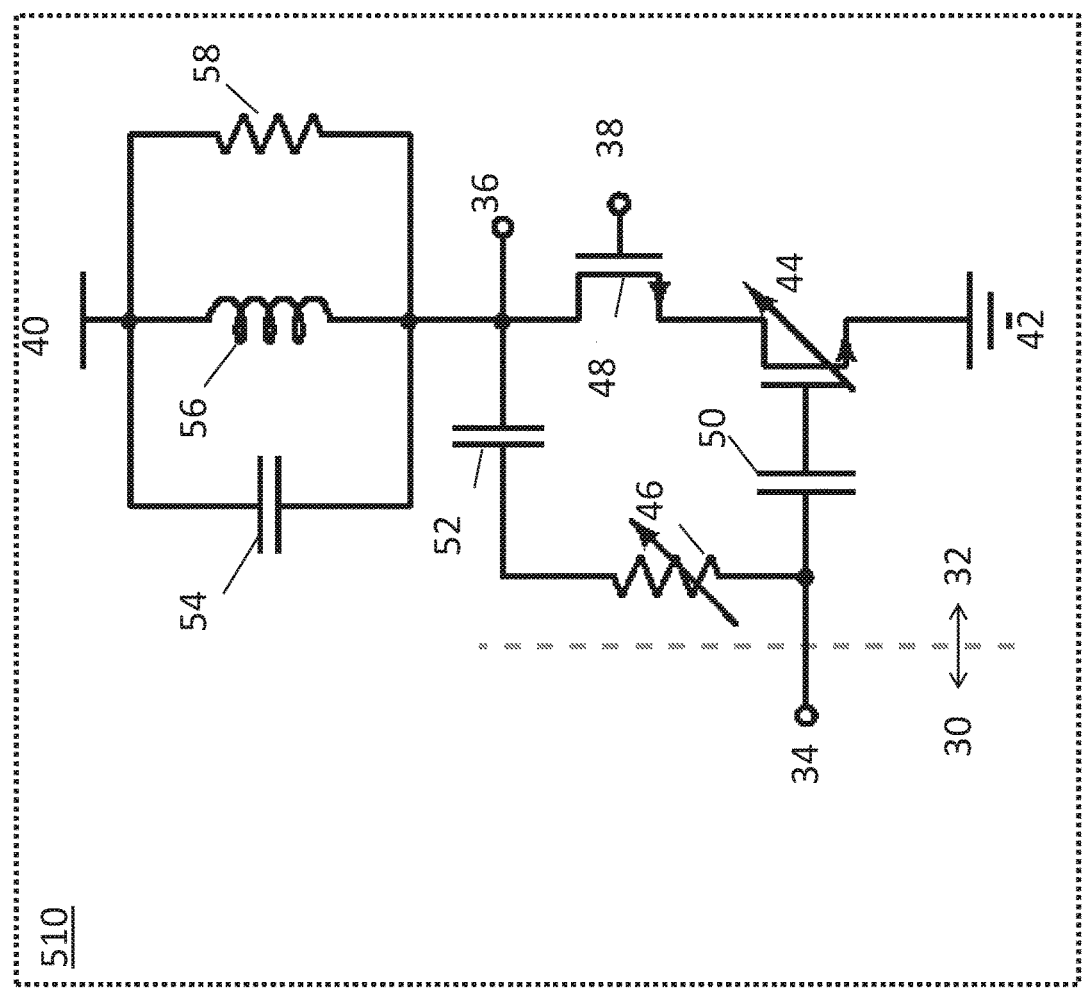
FIG. 5 shows an amplifier arrangement for use within a radio frequency receiver device in accordance with an embodiment of the present invention.

FIG. 5 shows an amplifier arrangement 510 for use within a radio frequency receiver device in accordance with an embodiment of the present invention. The Applicant has appreciated that a device that could be designed with the ability to have both on- or off-chip impedance matching, while exhibiting the same voltage gain $A_v$, noise figure NF and linearity characteristics for the entire radio receiver in both configurations would be very advantageous. In practice, this means that an LNA 510 with configurable input impedance matching should exhibit approximate the same voltage gain $A_v$, noise figure NF and linearity (measured using the IIP3) in both configurations, i.e. both with on- and off-chip matching.

Similarly to the LNAs 110, 210 described with reference to FIGS. 3 and 4, the LNA 510 illustrated conceptually in FIG. 5 comprises: an input terminal 34; an output terminal 36; an nMOSFET cascode transistor 48 with a gate terminal 38; a feedback capacitor 52; a DC block capacitor 50; and a resistor-inductor-capacitor (RLC) resonance arrangement including a resistor 58, an inductor 56 and a capacitor 54. As can be seen from FIG. 5, all of the components of the amplifier 510 are on the "on-chip" side 32 and no components are present on the "off-chip" side 30. Of course, in the case of an external matching network being used, there will be additional external components connected on the "off-chip side 30 that are not shown in this particular example). The amplifier 510 is connected between a power supply rail 40 and ground 42.

However, in contrast to the LNAs 110, 210 described previously, the LNA 510 embodying the present invention comprises an nMOSFET RF input transistor 44 with configurable transconductance as indicated by the arrow through the transistor symbol. The feedback resistor 46 arranged in the feedback path of the LNA 510 is also configurable. In this particular instance, "configurable" means that the transconductance of the RF input transistor 44 and the resistance of the feedback resistor 46 can be set to either a first pair of values $gm_1$ and $R_{F1}$ or to a second pair of values $gm_2$ and $R_{F2}$ depending on whether it is to be used with on-chip or off-chip impedance matching respectively. As discussed earlier, in practice, $R_{F1} < R_{F2}$ and $gm_1 > gm_2$.

Of course, the LNA 510 in FIG. 5 is a simplified conceptual illustration as transistors with configurable transconductance are not a component typically available per se. However, the Applicant has devised methods for altering the transconductance of the RF input transistor 44 as will be described below with reference to FIGS. 7 and 8. The Applicant has also devised methods for altering the resistance of the feedback resistor 46 as will be described with reference to FIGS. 8A and 8B.

Figure 6:
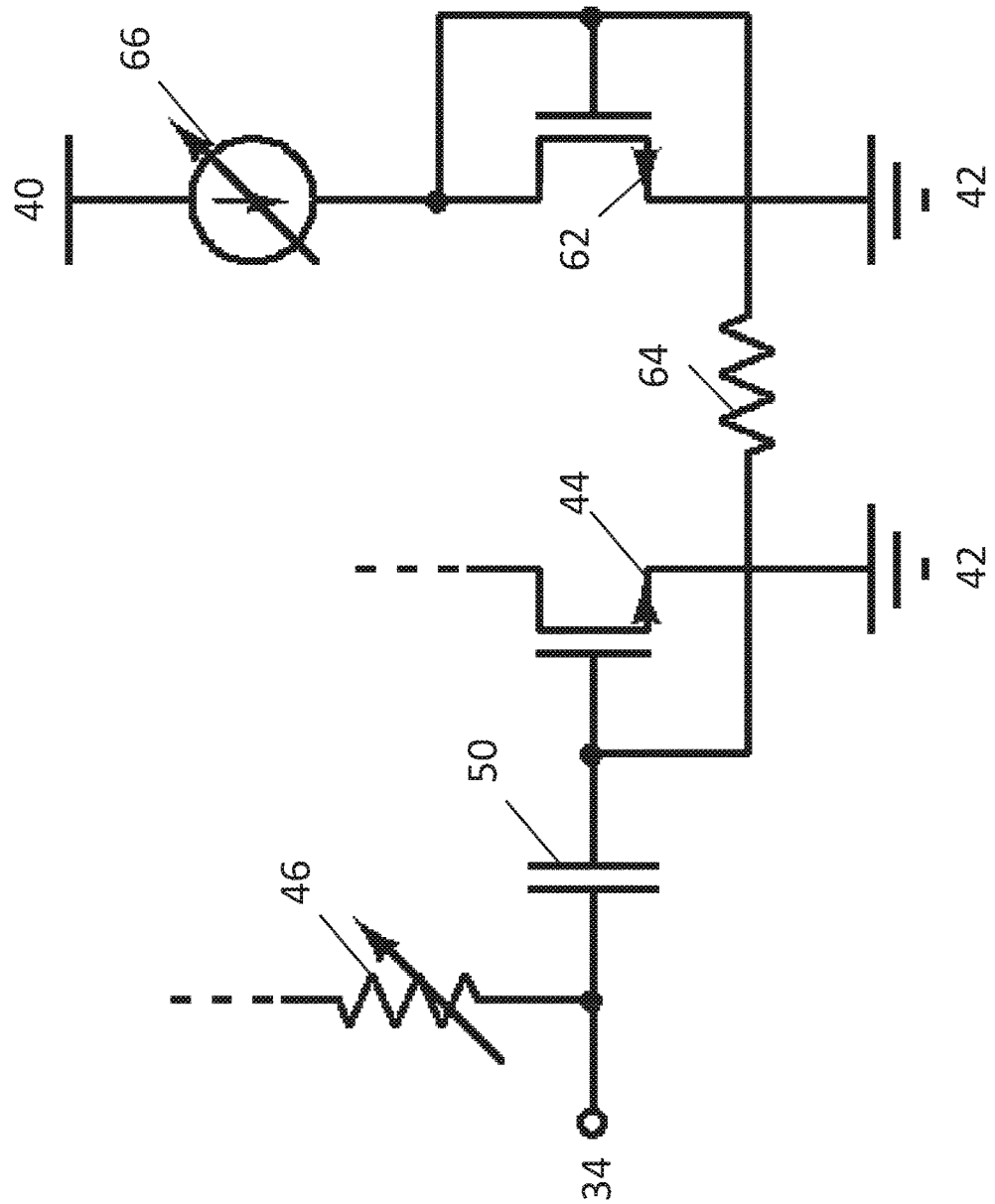
FIG. 6 shows an amplifier arrangement with current source controlled transconductance in accordance with an embodiment of the invention.

FIG. 6 shows an amplifier arrangement with current source controlled transconductance in accordance with an embodiment of the invention. Here, a current source 66 is used to bias the RF input transistor 44. A mirror transistor 62 forms a simple current mirror with the RF input transistor 44, which sets the bias current for the RF input transistor 44. The bias resistor 64 isolates the bias circuit (i.e. the current source 66 and mirror transistor 62) from the LNA input terminal 34 at RF frequencies. As discussed previously, the transconductance of RF input transistor 44 needs to be configured or switched to the correct value for on- or off-chip impedance matching as required.

In this arrangement, the current source 66 is variable, such that it can provide a desired current from the power supply rail 40 through the mirror transistor 62 to ground 42. While variable current sources are typically able to take any value between lower and upper limits, in this embodiment the current source 66 can be set to one of two discrete current values.

The amount of current that flows through the mirror transistor 62 directly determines the amount of current that flows through the RF input transistor 44, i.e. it controls the current density through the RF input transistor 44, in turn altering its transconductance. Since the current source 66 is able to provide two discrete current values, this causes the RF input transistor 44 to have either a first transconductance value $gm_1$ for use with on-chip impedance matching; or a second transconductance value $gm_2$ for use with off-chip impedance matching.

Figure 7:
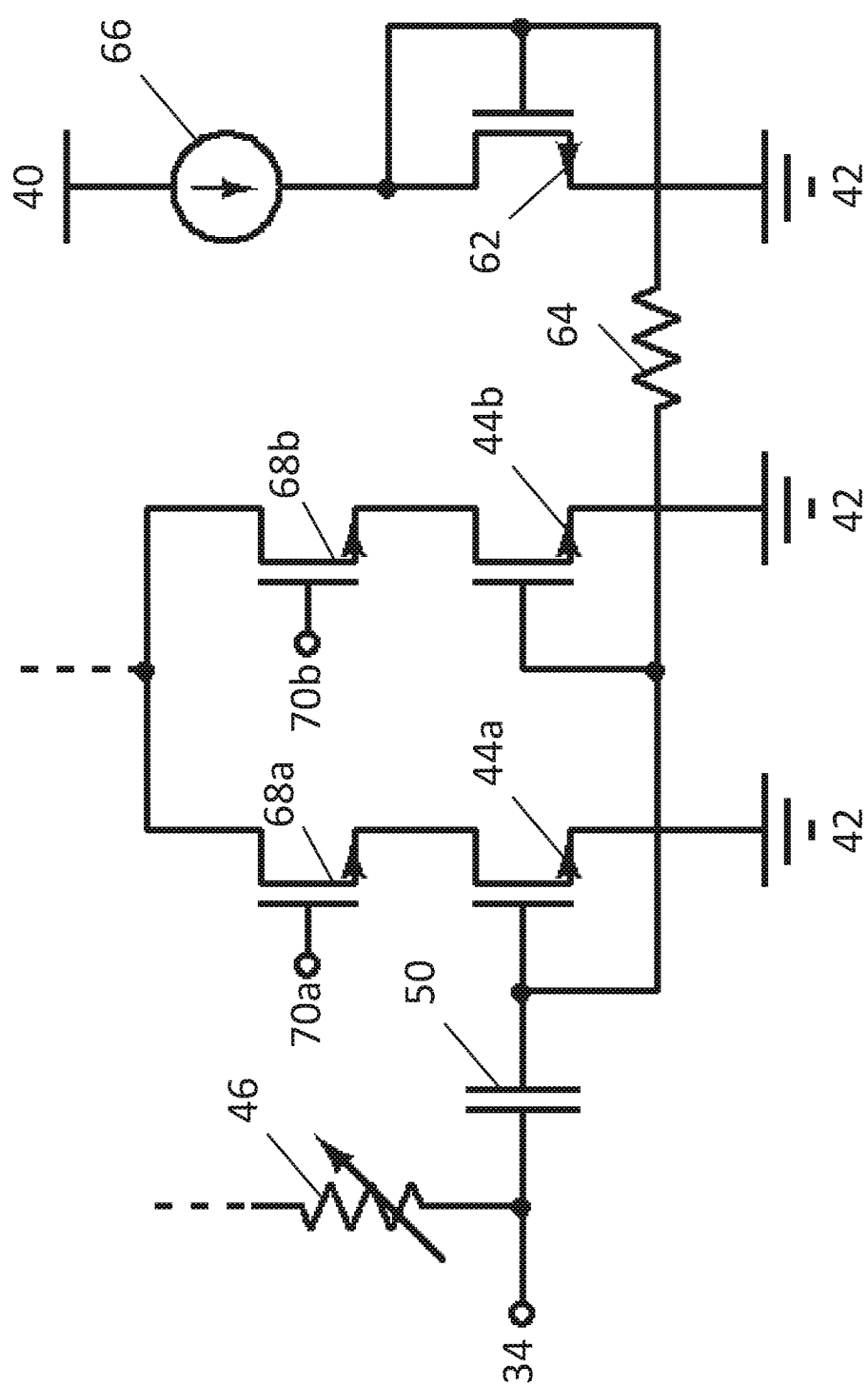
FIG. 7 shows an amplifier arrangement with aspect ratio controlled transconductance in accordance with an embodiment of the invention.
Figure 8:
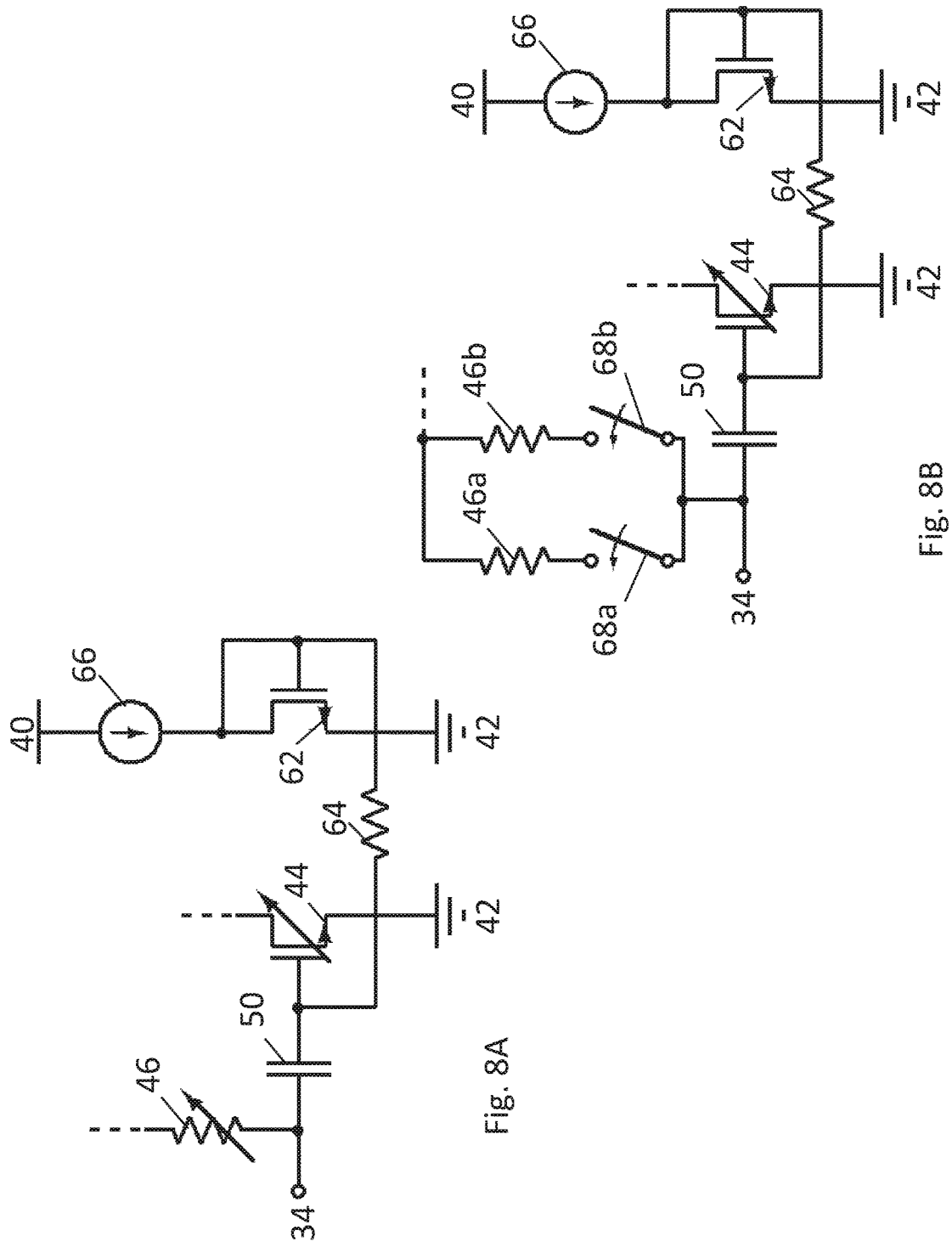
FIGS. 8A and 8B show amplifier arrangements with configurable feedback resistance in accordance with an embodiment of the invention.

FIG. 7 shows an amplifier arrangement with aspect ratio controlled transconductance in accordance with an embodiment of the invention. In this arrangement, there are two RF input transistors 44a, 44b arranged in parallel having first and second aspect ratios $$\frac{W_1}{L_1} \text{ and } \frac{W_2}{L_2}$$

respectively such that the first transistor 44a has a first transconductance value $gm_1$ for use with on-chip impedance matching and the second transistor 44b has a second transconductance value $gm_2$ for use with off-chip impedance matching.

Each of the RF input transistors 44a, 44b has its drain terminal connected to the source terminal of an nMOSFET selection transistor 68a, 68b. The gate terminals of each of the selection transistors 68a, 68b are connected to selection terminals 70a, 70b; while the drain terminals of the selection transistors 68a, 68b are connected to the RLC resonance circuit and back to the input terminal 34 via the feedback network as before.

Different voltages (e.g. +5 V and 0 V) can then be applied to selection terminals 70a and 70b in order to selectively enable one of the selection transistors 68a, 68b while disabling the other. This ensures that current can only flow through one of the RF input transistors 44a, 44b at any given time, while the other is essentially disconnected from the circuit. The enabled selection transistor 68a, 68b then simply acts as a cascode transistor during operation.

In this arrangement, the current source 66 provides a constant bias current through the mirror transistor 62, which allows for constant biasing of the RF input transistor 44a, 44b in use. Meanwhile it is the difference in aspect ratios $$\frac{W_1}{L_1}, \frac{W_2}{L_2}$$

that provide the variable transconductance.

FIGS. 8A and 8B show amplifier arrangements with configurable feedback resistance in accordance with an embodiment of the invention. In FIG. 8a, the variable feedback resistance is achieved by simply using a variable resistor 46 (e.g. a rheostat). However, this is impractical for use in integrated circuits.

Instead, the arrangement in FIG. 8B uses two different feedback resistors 46a, 46b with resistance values of $R_{F1}$ and $R_{F2}$ respectively. Each of these feedback resistors 46a, 46b is in parallel with one another, and in series with a switch 68a, 68b respectively. These switches may each be physical switches or may be implemented in silicon using e.g. a MOSFET wherein applying a sufficient gate-source voltage thereto "completes" the feedback path including the appropriate resistor 46a, 46b while leaving the other disconnected. This allows for the appropriate resistance value of $R_{F1}$ or $R_{F2}$ to be used for on- or off-chip impedance matching as appropriate.

Figure 9:
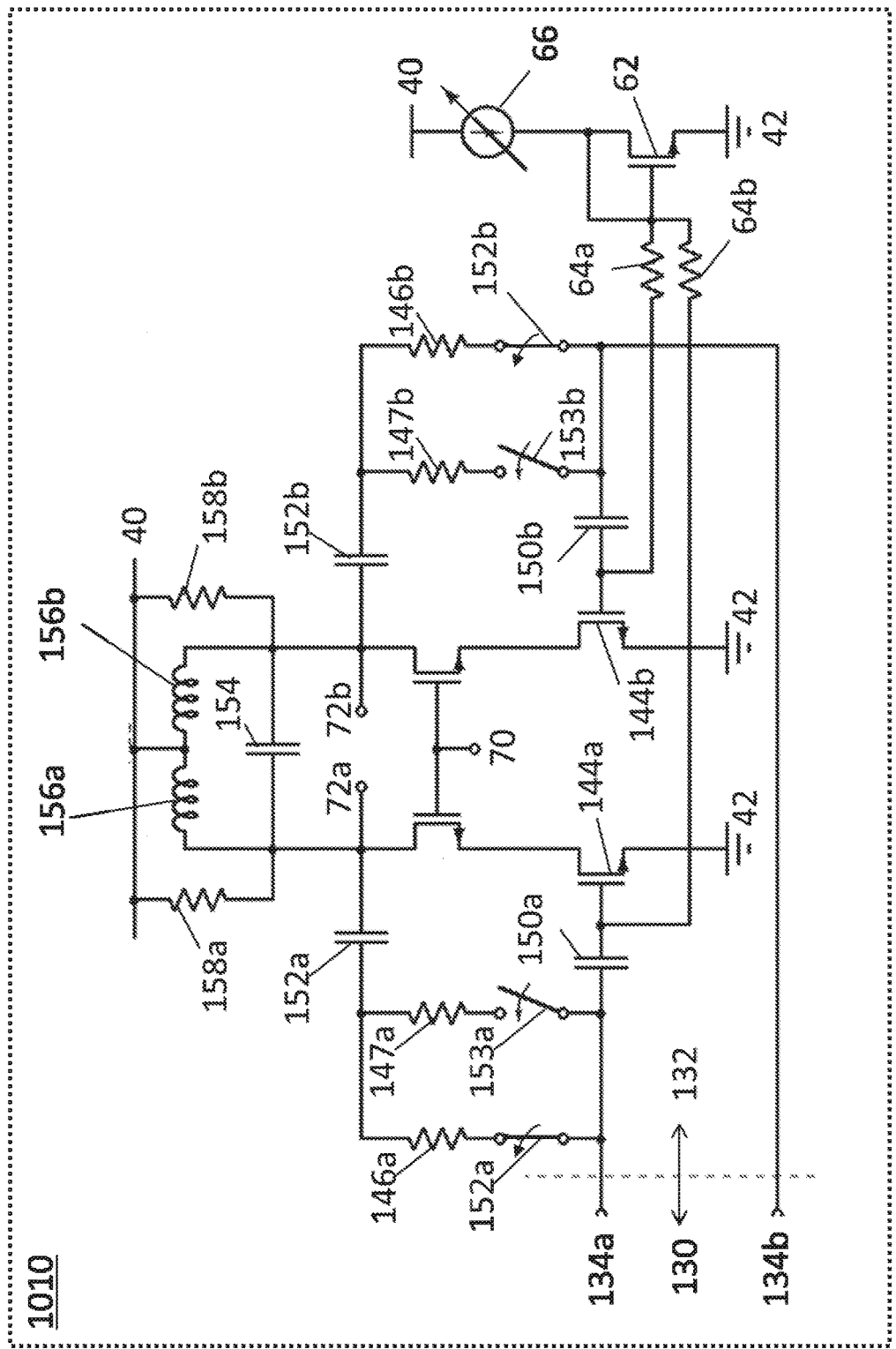
FIG. 9 shows a differential amplifier arrangement with a variable current source in accordance with an embodiment of the invention.

FIG. 9 shows a differential amplifier arrangement 1010 with a variable current source 66 for use in a radio frequency receiver device that utilises on-chip impedance matching. Here, two identical RF input transistors 144a, 144b form a grounded-source pair arrangement that amplify a differential signal input across input terminals 134a, 134b. The arrangement shown in FIG. 9 (and similarly in FIG. 10) shows a bias terminal 70 to which a bias voltage (e.g. the supply voltage 42) is applied.

The variable current source 66 can be set to either a first bias current $I_{b1}$ or a second bias current $I_{b2}$, which sets the transconductance values of the RF input transistors 144a, 144b to either $gm_1$ or $gm_2$ respectively.

The feedback resistance on each side of the amplifier may be switched between first and second feedback resistance values $R_{F1}$ and $R_{F2}$ using switches 152a, 152b, 153a, 153b. If the RF input transistors 144a, 144b are set to their first transconductance value of $gm_1$ and the feedback is set to the first feedback resistance value of $R_{F1}$ by closing switches 152a, 152b and opening switches 153a, 153b, the LNA 1010 is ready for use with on-chip impedance matching.

Figure 10:
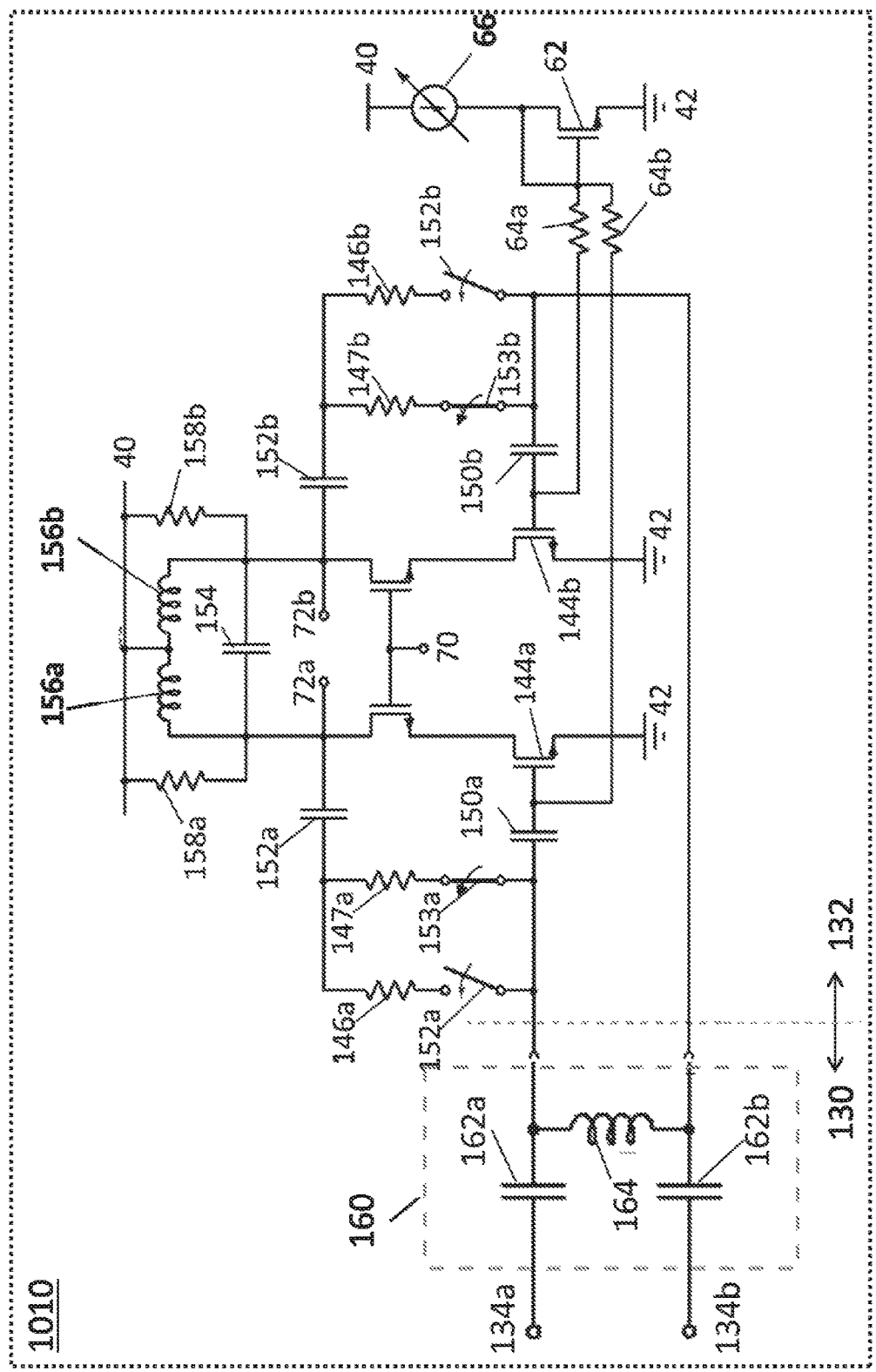
FIG. 10 shows the differential amplifier arrangement of FIG. 9 with an external impedance matching circuit connected.

By way of contrast, FIG. 10 shows the differential amplifier arrangement 1010 of FIG. 9 utilising an external impedance matching circuit 160 for off-chip impedance matching. In order to achieve this, the RF input transistors 144a, 144b are set to their second conductance value of $gm_2$ and the feedback is set to the second feedback resistance value of $R_{F2}$ by opening switches 152a, 152b and closing switches 153a, 153b, setting the LNA 1010 to its off-chip mode.

Figure 11:
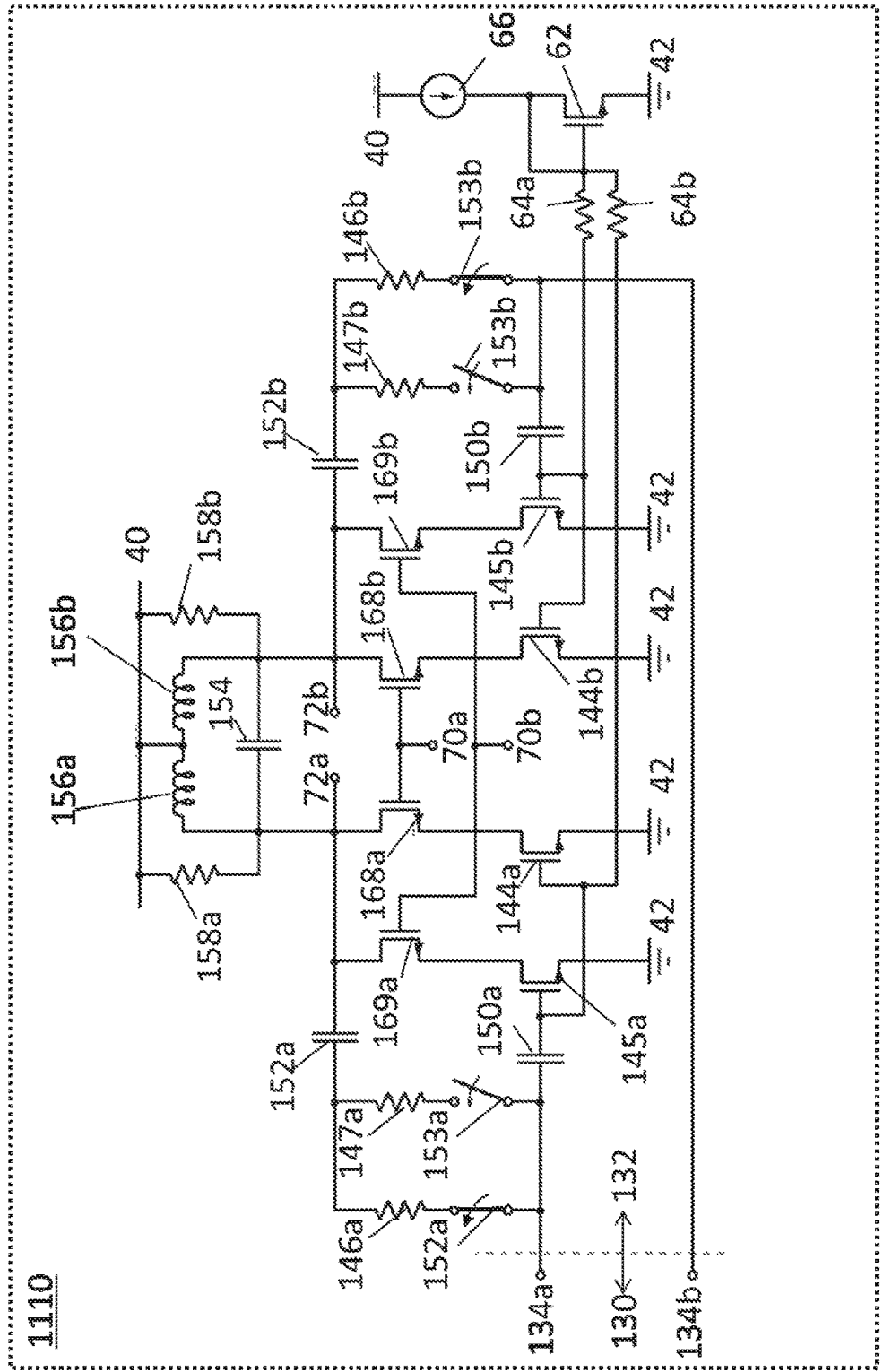
FIG. 11 shows a differential amplifier arrangement with a fixed current source in accordance with an embodiment of the invention.

FIG. 11 shows a differential amplifier arrangement 1110 with a fixed current source 66 in accordance with an embodiment of the invention. Similarly to the LNA 1010 described with reference to FIGS. 9 and 10, two identical RF input transistors 144a, 144b form a grounded-source pair arrangement.

Similarly to the LNA 1010 of FIGS. 9 and 10, the feedback resistance may be switched between first and second feedback resistance values $R_{F1}$ and $R_{F2}$ using switches 152a, 152b, 153a, 153b. If the RF input transistors 144a, 144b are set to their first transconductance value of $gm_1$ and the feedback is set to the first feedback resistance value of $R_{F1}$ by closing switches 152a, 152b and opening switches 153a, 153b, the LNA 1110 is ready for use with on-chip impedance matching.

However, by way of contrast to the LNA 1010 of FIGS. 9 and 10, the effective transconductance is controlled by applying high or low voltages to control terminals 70a, 70b as described previously with reference to FIG. 7. In this arrangement, there are two pairs of parallel RF input transistors—a first pair 144a, 145a being one parallel arrangement and a second pair 144b, 145b being a further parallel arrangement. One transistor 144a, 144b in each pair has a first aspect ratio $$\frac{W_1}{L_1}$$

while the other transistor 145a, 145b has a second aspect ratio $$\frac{W_2}{L_2}.$$

This means that for a given, fixed current from the current source 66, one transistor 144a, 144b in each pair has a first transconductance value $gm_1$ for use with on-chip impedance matching while the other transistor 145a, 145b in the pair has a second transconductance value $gm_2$ for use with off-chip impedance matching.

Each of the RF input transistors 144a, 144b, 145a, 145b have their respective drain terminal connected to the source terminal of an nMOSFET selection transistor 168a, 168b, 169a, 169b respectively. The gate terminals of one pair of selection transistors 168a, 168b are connected to one of the selection terminals 70a (for on-chip mode) while the gate terminals of the other pair of selection transistors 169a, 169b are connected to the other selection terminal 70b (for off-chip mode). The drain terminals of each of the selection transistors 168a, 168b, 169a, 169b are connected to the RLC resonance circuit and back to the input terminal 134 via the feedback network as before.

Different voltages (e.g. +5 V and 0 V) can be applied to the selection terminals 70a and 70b in order to selectively enable one of one of the selection transistor pairs 168a, 168b or 169a, 169b while disabling the other. This ensures that current can only flow through one pair of the RF input transistors 144a, 144b or 145a, 145b at any given time, while the other pair is essentially taken out of the circuit. The enabled selection transistor pair 168a, 168b or 169a, 169b simply act as a cascode transistor during operation.

Thus by opening switches 152a, 152b, closing switches 153a, 153b and applying a high voltage to the "on-chip" selection terminal 70a and a low voltage to the "off-chip" selection terminal 70b, the feedback resistance is set to $R_{f1}$ and the effective transconductance is $gm_1$.

Figure 12:
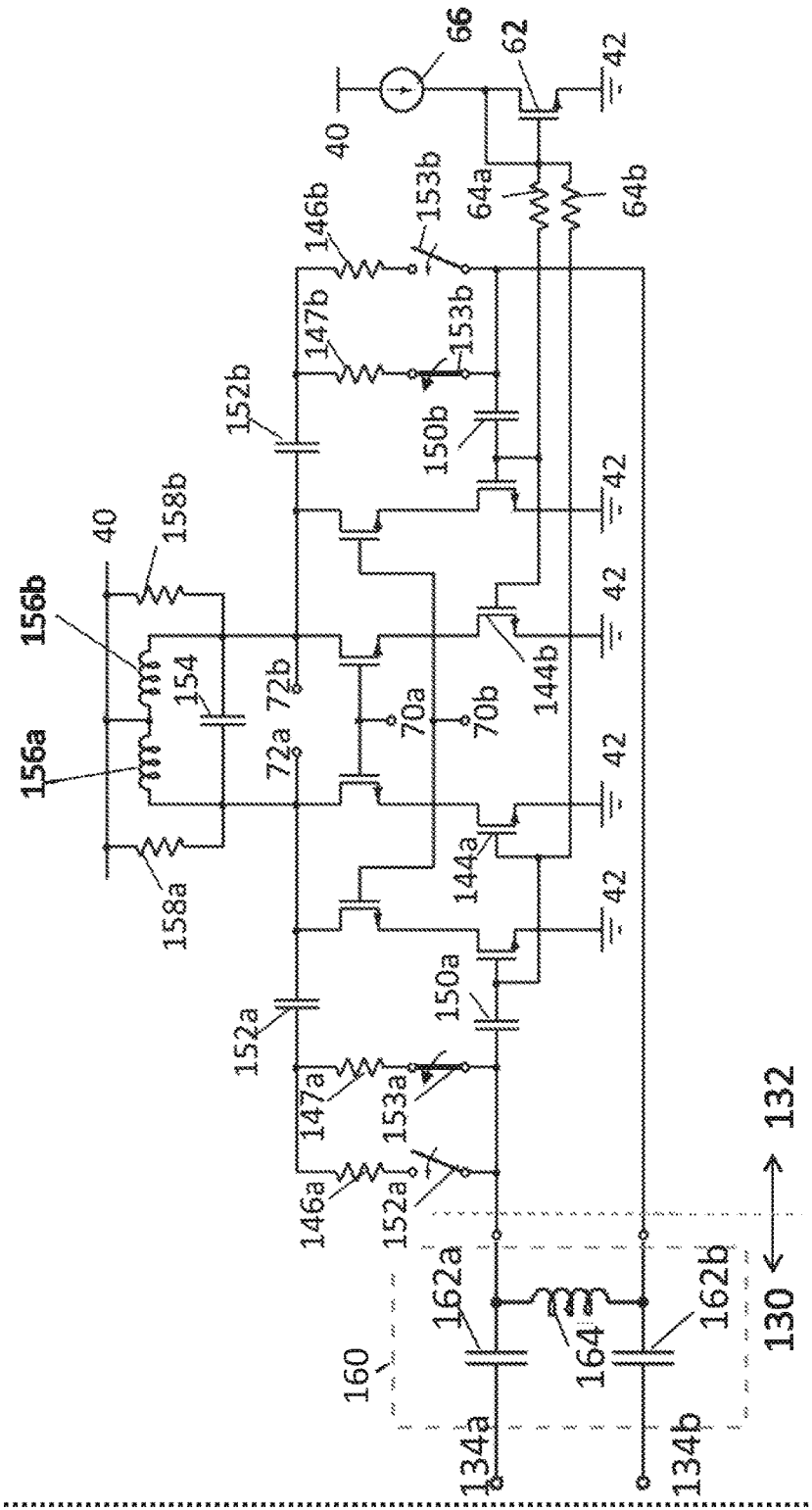
FIG. 12 shows the differential amplifier arrangement of FIG. 11 with an external impedance matching circuit connected.

FIG. 12 shows the differential amplifier arrangement 1110 of FIG. 11 utilising an external impedance matching circuit 160 for off-chip impedance matching. In this arrangement, switches 152a, 152b are closed, switches 153a, 153b are open, a low voltage is applied to the "on-chip" selection terminal 70a and a high voltage is applied to the "off-chip" selection terminal 70b. This sets the feedback resistance to $R_{f2}$ and the effective transconductance is $gm_2$, and thus the amplifier arrangement 1110 is ready for use in its off-chip impedance matching mode.

As described previously, the Applicant has appreciated that it is advantageous for the amplifier, and by extension the entire radio receiver, to exhibit the same gain and noise characteristics, regardless of whether on-chip or off-chip impedance matching is used, such that a customer need only choose between cost and power consumption.

If, from Equations 7 and 11, it is assumed that the noise in a resistive feedback LNA is dominated by the noise in the RF input transistor(s) 44, 144a, 144b, and the noise figure NF is designed to be equal in both configurations, i.e. in both on- and off-chip impedance matching modes, Equations 18 and 19 below are obtained:

Approximation of noise figure in a resistive feedback in on- and off-chip impedance matching modes $$NF \approx 1 + \frac{\gamma}{g_{m1}R_s} \approx 1 + \frac{\gamma}{g_{m2}R_{EQ}} \quad \text{Equation 18}$$

$$g_{m1}R_s = g_{m2}R_{EQ}$$

Equation 19: Relationship Between First and Transconductance Values, Source Impedance and Impedance Looking into the On-chip Input of the LNA in the Off-chip Matching Configuration By using the relation of Equation 19 in Equation 9, Equation 20 below is obtained:

$$R_{F2} = (g_{m2}R_{EQ} - 1)R_L = (g_{m1}R_s - 1)R_L$$

Equation 20: Second Feedback Resistance Value for Off-chip Matching in Terms of On-chip Matching Variables Only Thus, once the component values for $gm_1$ and $R_L$ are known from initially designing the LNA 510, 1010, 1110 for on-chip impedance matching, an initial value for the feedback resistor ($R_{F2}$) needed for off-chip impedance matching while retaining the same LNA noise figure in both configurations can be obtained using Equation 20. Also, by requiring the LNA voltage gain $A_v$ be the same in both configurations and using Equation 13, the impedance transformation ratio in the external impedance matching circuit 60, 160 must fulfil the condition given below in Equation 21:

Impedance transformation ratio for external matching circuit 60, 160

$$N = \frac{R_{F2}}{R_{F1}} = \frac{(g_{m1}R_s - 1)R_L}{R_{F1}} \quad \text{Equation 21}$$

Thus once $gm_1$, $R_{F1}$ and $R_L$ are available from the design of LNA 510, 1010, 1110 with on-chip input impedance matching and the value of N is determined, the external matching circuit 60, 160 for off-chip impedance matching can be designed as appropriate.

Simulations have been performed using 55 nm CMOS technology at LTE Band I (2170 MHz). The LNA performance is presented below in Table 1 for both on-chip and off-chip impedance matching configurations. In both configurations, the differential LNA input impedance is designed to be approximately 100Ω. This is confirmed by the input reflection coefficient $s_{11}$, which is well below −10 dB (which is a typical requirement used in the art to measure the quality of input matching).

TABLE 1

Simulated performance of exemplary differential resistive-feedback LNA with configurable input impedance matching. Simulations with 55 nm CMOS technology at Band I (2170 MHz).

| Parameter | | | | |
|---|---|---|---|---|
| $s_{11}$ (dB) | Gain (dB) | NF (dB) | $I_{DD}$ (mA) | LNA configuration |
| −17 | 20.8 | 1.6 | 13.3 | LNA with on-chip impedance matching |
| −22 | 21.1 | 1.6 | 7.9 | LNA with external impedance matching network |

From Table 1 it can be seen that in both LNA configurations, the LNA has about 21 dB voltage gain and 1.6 dB NF. When configured for on-chip input impedance matching, the LNA consumes about 13.3 mA whereas when configured to be used with an external impedance matching circuit, the LNA draws about 7.9 mA. Thus, when used in the off-chip impedance matching configuration, a saving of approximately 40% in LNA power consumption can be achieved.

Thus it will be appreciated that the described embodiments of the present invention provide a radio frequency receiver device comprising one or more amplifiers that can be arranged for either on- or off-chip impedance matching without incurring a penalty to the LNA or radio receiver noise figure or linearity thereof. Although particular embodiments have been described in detail, it will be appreciated by those skilled in the art that many variations and modifications are possible using the principles of the invention set out herein.

The invention claimed is:

1. A radio frequency receiver device comprising:
   a receiver input arranged to receive signals having one or more frequency components within a frequency spectrum;
   a filter having a filter output impedance; and
   an amplifier comprising: an amplifier input connected to the filter output; an amplifier output; at least one radio frequency input transistor; and a feedback circuit including at least one feedback resistor, said feedback circuit being connected between the amplifier input and the amplifier output;
   wherein the device is arranged to be selectably operable in:
   a first mode wherein the amplifier has first feedback resistance and transconductance values respectively such that the amplifier input impedance and the filter output impedance are substantially the same; and
   a second mode wherein the amplifier has second feedback resistance and transconductance values respectively such that upon connection of a predetermined external impedance matching circuit between the filter and the amplifier, the amplifier input impedance and the filter output impedance are substantially the same.

2. The device as claimed in claim 1, wherein a noise figure associated with the device when it is operated in the first mode is substantially equal to the noise figure when it is operated in the second mode with the predetermined external impedance matching circuit connected.

3. The device as claimed in claim 1, wherein a gain associated with the device when it is operated in the first mode is substantially equal to the gain when it is operated in the second mode with the predetermined external impedance matching circuit connected.

4. The device as claimed in claim 1, wherein the amplifier further comprises:
a mirror transistor arranged to form a current mirror arrangement with the at least one radio frequency input transistor; and
a variable current source operable to set the current flowing through the current mirror arrangement to either a first current in the first mode or a second current in the second mode.

5. The device as claimed in claim 1, wherein the amplifier comprises first and second radio frequency input transistors in parallel, wherein the first radio frequency input transistor has a first aspect ratio and is in series with a first selection transistor, and the second radio frequency input transistor has a second aspect ratio and is in series with a second selection transistor, and wherein the first and second aspect ratios are different.

6. The device as claimed in claim 1, wherein the feedback circuit comprises first and second feedback resistors in parallel, wherein the first feedback resistor is in series with a first switch and wherein the second feedback resistor is in series with a second switch, the first and second switches being arranged such that while one switch is closed, the other is open.

7. The device as claimed in claim 1, wherein the amplifier is a low noise amplifier.

8. The device as claimed in claim 1, wherein the feedback circuit further includes at least one feedback capacitor.

9. The device as claimed in claim 1, wherein the radio frequency receiver device further comprises a downconversion mixer connected to the output of the amplifier.

10. The device as claimed in claim 9, comprising an analogue baseband filter connected to an output of the downconversion mixer.

11. The device as claimed in claim 10, wherein said analogue baseband filter comprises a low pass filter.

12. The device as claimed in claim 10, comprising an analogue-to-digital converter connected to an output of the analogue baseband filter.

13. The device as claimed in claim 1, wherein the amplifier input is single-ended.

14. The device as claimed claim 1, wherein the amplifier input is differential.

15. The device as claimed in claim 1, wherein the amplifier output is single-ended.

16. The device as claimed in claim 1, wherein the amplifier output is differential.

17. The device as claimed in claim 1, further comprising a plurality of amplifiers and a plurality of filters, wherein the input of each amplifier is connected to the output of a corresponding filter such that in the first mode each amplifier has first feedback resistance and transconductance values respectively such that the input impedance of each amplifier and the output impedance of the filter to which said amplifier is connected are substantially the same; and in the second mode each amplifier has second feedback resistance and transconductance values respectively such that upon connection of predetermined external impedance matching circuits between each amplifier and its corresponding filter, the input impedance of each amplifier and the output impedance of the filter to which said amplifier is connected are substantially the same.

18. The device as claimed in claim 1, wherein the filter is a bandpass filter.

19. The device as claimed in claim 1, comprising a radio frequency integrated circuit.

20. A radio frequency receiver device comprising:
a receiver input arranged to receive signals having one or more frequency components within a frequency spectrum;
a plurality of filters each having a filter output impedance; and
a plurality of amplifiers each comprising: an amplifier input connected to the output of a corresponding one of the plurality of filters; an amplifier output; at least one radio frequency input transistor; and a feedback circuit including at least one feedback resistor, said feedback circuit being connected between the amplifier input and the amplifier output;
wherein the device is arranged to be selectably operable in:
a first mode wherein each amplifier has first feedback resistance and transconductance values respectively such that each amplifier input impedance is substantially the same as the output impedance of the corresponding filter; and
a second mode wherein each amplifier has second feedback resistance and transconductance values respectively such that upon connection of a predetermined external impedance matching circuit between each amplifier and the corresponding filter, each amplifier input impedance is substantially the same as the output impedance of the corresponding filter.

21. The device as claimed in claim 20, wherein a noise figure associated with the device when it is operated in the first mode is substantially equal to the noise figure when it is operated in the second mode with the predetermined external impedance matching circuit connected between each amplifier and the corresponding filter.

22. The device as claimed in claim 20, wherein a gain associated with the device when it is operated in the first mode is substantially equal to the gain when it is operated in the second mode with the predetermined external impedance matching circuit connected between each amplifier and the corresponding filter.

* * * * *